United States Patent
Chang et al.

(10) Patent No.: US 7,773,067 B2
(45) Date of Patent: Aug. 10, 2010

(54) LIQUID CRYSTAL DISPLAY WITH THREE-LEVEL SCANNING SIGNAL DRIVING

(75) Inventors: Chia-Wen Chang, Miao-Li (TW); Chin-Chang Chen, Miao-Li (TW)

(73) Assignee: Innolux Display Corp., Miao-Li County (TW)

( * ) Notice: Subject to any disclaimer, the term of this patent is extended or adjusted under 35 U.S.C. 154(b) by 847 days.

(21) Appl. No.: 11/633,237

(22) Filed: Dec. 4, 2006

(65) Prior Publication Data

US 2007/0126684 A1    Jun. 7, 2007

(30) Foreign Application Priority Data

Dec. 2, 2005    (TW)    .............................. 94142464 A

(51) Int. Cl.
*G09G 3/36*    (2006.01)
(52) U.S. Cl. .............................. 345/95; 345/92; 345/204
(58) Field of Classification Search ................... 345/92, 345/95, 100
See application file for complete search history.

(56) References Cited

U.S. PATENT DOCUMENTS

| | | | | |
|---|---|---|---|---|
| 5,526,012 A | * | 6/1996 | Shibahara | ..................... 345/92 |
| 5,986,631 A | * | 11/1999 | Nanno et al. | ................... 345/94 |
| 6,307,409 B1 | | 10/2001 | Wrathall | |
| 6,483,889 B2 | * | 11/2002 | Kim et al. | ....................... 377/54 |
| 6,501,453 B1 | * | 12/2002 | Wong | ........................... 345/90 |
| 7,436,923 B2 | * | 10/2008 | Tobita | .......................... 377/64 |
| 2004/0217935 A1 | * | 11/2004 | Jeon et al. | .................... 345/100 |
| 2006/0262074 A1 | * | 11/2006 | Shimoda | ...................... 345/100 |
| 2007/0164972 A1 | * | 7/2007 | Chang | ......................... 345/100 |

* cited by examiner

*Primary Examiner*—Richard Hjerpe
*Assistant Examiner*—Andrew Schnirel
(74) *Attorney, Agent, or Firm*—Wei Te Chung

(57) ABSTRACT

An exemplary thin film transistor liquid crystal display (TFT-LCD) (100) includes an LCD panel having a number n (where n is a natural number) of gate lines G1-Gn that are parallel to each other, a data driving circuit (120), and a gate driving circuit (110). The gate driving circuit sequentially providing 3-level scanning signals to scan the gate lines G1-Gn. Each 3-level scanning signal sequentially includes a gate-on voltage, a feed-through compensation voltage, and a gate-off voltage wherein the gate-on voltage starts to be provided to a (Gi+1)th ($1 \leq i \leq n-1$) of the gate lines G1-Gn at the time when the feed-through compensation voltage starts to be provided to a (Gi)th of the gate lines G1-Gn.

4 Claims, 5 Drawing Sheets

LIQUID CRYSTAL DISPLAY WITH THREE-LEVEL SCANNING SIGNAL DRIVING

FIELD OF THE INVENTION

The present invention relates to a thin film transistor liquid crystal display (TFT-LCD), and a method for driving a TFT-LCD.

GENERAL BACKGROUND

A TFT-LCD has the advantages of portability, low power consumption, and low radiation, and has been widely used in various portable information products such as notebooks, personal digital assistants (PDAs), video cameras and the like. Furthermore, the TFT-LCD is considered by many to have the potential to completely replace CRT (cathode ray tube) monitors and televisions.

FIG. 6 is an abbreviated circuit diagram of a typical TFT-LCD. The TFT-LCD 10 includes an LCD panel (not shown), a data driving circuit 2, and a gate driving circuit 1. The LCD panel includes a thin film transistor (TFT) substrate (not shown), a color filter (CF) substrate (not shown) arranged in a position facing the TFT substrate, and a liquid crystal layer (not shown) sandwiched between the TFT substrate and the CF substrate.

The TFT substrate includes a number n (where n is a natural number) of gate lines (G1-Gn) that are parallel to each other and that each extend along a first direction, and a number m (where m is also a natural number) of data lines (D1-Dm) that are parallel to each other and that each extend along a second direction orthogonal to the first direction. The TFT substrate also includes a plurality of thin film transistors (TFTs) 3 that function as switching elements. The TFT substrate further includes a plurality of pixel electrodes 6 formed on a surface thereof facing the CF substrate. Each TFT 3 is provided in the vicinity of a respective point of intersection of the gate lines (G1-Gn) and the data lines (D1-Dm).

The CF substrate includes a plurality of common electrodes 7 opposite to the pixel electrodes 6. In particular, the common electrodes 7 are formed on a surface of the CF substrate facing the TFT substrate, and are made from a transparent material such as ITO (Indium-Tin Oxide) or the like.

Each TFT 3 includes a gate electrode 31, a source electrode 32, and a drain electrode 33. An exemplary one of the TFTs 3 is labeled in detail in FIG. 6. In this TFT 3, the gate electrode 31, the source electrode 32, and the drain electrode 33 are connected to a gate line Gn-1, a data line Dm-1, and one pixel electrode 6 respectively. The pixel electrode 6, the common electrode 7 and the liquid crystal material sandwiched between the pixel electrode 6 and one common electrode 7 are represented as a liquid crystal capacitor (Clc) 8. A storage capacitor (Cs) 4 is formed between a next gate line Gn and the drain electrode 33 of the TFT 3.

FIG. 7 shows abbreviated voltage waves of a plurality of scanning signals generated by the gate driving circuit 1. V5 represents a gate-on voltage that is a high voltage generated by the gate driving circuit 1. V6 represents a gate-off voltage that is a low voltage generated by the gate driving circuit 1. The gate driving circuit 1 sequentially provides a gate-on voltage and a gate-off voltage as a scanning signal to one gate line Gn each time. In a frame time (shown as a double-headed arrow), the gate driving circuit 1 sequentially scans the gate lines from G1 to Gn with the scanning signals.

When the gate-on voltage V5 is provided to the gate electrode 31 of the TFT 3 via the gate line Gn-1, the TFT 3 connected to the gate line Gn-1 is turned on. At the same time, a gradation voltage $V_d$ generated by the data driving circuit 2 is provided to the pixel electrode 6 via the data line Dm-1 and the activated TFT 3 in series. The potentials of all the common electrodes 7 are set at a uniform potential $V_{com}$. Thus, an electric field is generated due to the voltage difference between the pixel electrode 6 and the common electrode 7. The electric field is used to control the amount of light transmission of the corresponding pixel unit.

When the gate-off voltage V6 is provided to the gate electrode 31 of the TFT 3 via the gate line Gn-1, the TFT 3 is turned off. The gradation voltage that is applied to the liquid crystal capacitor 8 when the TFT 3 is turned on is maintained after the TFT 3 is turned off. The gate driving circuit 1 providing gate-on and gate-off voltages to scan the gate lines (G1-Gn) is a so-called 2-level driving method.

However, due to the storage capacitor 4 between the drain electrode 33 of the TFT 3 connected to the gate line Gn-1 and the next gate line Gn adjacent to the gate line Gn-1, the gradation voltage $V_d$ applied to the pixel electrode 6 is liable to be distorted when a voltage of the next gate line Gn changes from the gate-on voltage V5 to the gate-off voltage V6. This kind of distorted voltage is known as a feed-through voltage. The feed-through voltage is liable to decrease the potential of the pixel electrode 6. Thus the so-called flicker phenomena may appear on a display screen of the LCD panel of the TFT-LCD 10.

What is needed, therefore, is a TFT-LCD and a method for driving the TFT-LCD which can overcome the above-described deficiencies.

SUMMARY

In one preferred embodiment, a TFT-LCD includes an LCD panel having a number n (where n is a natural number) of gate lines G1-Gn that are parallel to each other, a data driving circuit, and a gate driving circuit. The gate driving circuit sequentially providing 3-level scanning signals to scan the gate lines G1-Gn. Each 3-level scanning signal sequentially includes a first gate-on voltage, a first feed-through compensation voltage, and a first gate-off voltage wherein the gate-on voltage starts to be provided to a (Gi+1)th ($1 \leq i \leq n-1$) of the gate lines G1-Gn at the time when the feed-through compensation voltage starts to be provided to a (Gi)th of the gate lines G1-Gn.

Other advantages and novel features will become more apparent from the following detailed description when taken in conjunction with the accompanying drawings. In the drawings, all the views are schematic.

DETAILED DESCRIPTION OF PREFERRED EMBODIMENTS

Figure 1:
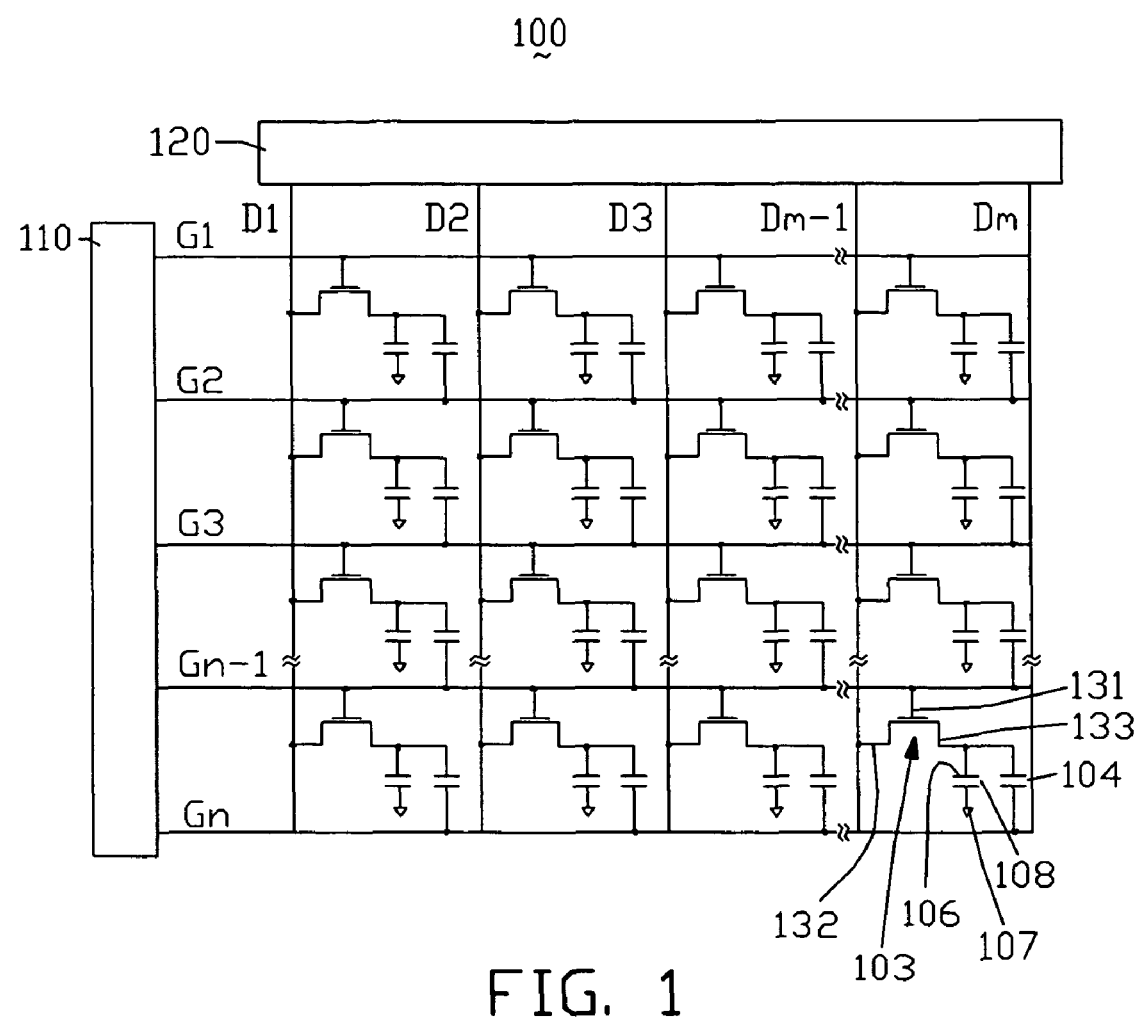
FIG. 1 is an abbreviated circuit diagram of a TFT-LCD according to a preferred embodiment of the present invention, the TFT-LCD including a gate driving circuit.

FIG. 1 is an abbreviated circuit diagram of a TFT-LCD according to a preferred embodiment of the present invention. The TFT-LCD 100 includes an LCD panel (not shown), a gate driving circuit 110, and a data driving circuit 120. The LCD panel includes a TFT substrate (not shown), a CF substrate (not shown) arranged in a position facing the TFT substrate, and a liquid crystal layer (not shown) sandwiched between the TFT substrate and the CF substrate.

The TFT substrate includes a number n (where n is a natural number) of gate lines (G1-Gn) that are parallel to each other and that each extend along a first direction, and a number m (where m is also a natural number) of data lines (D1-Dm) that are parallel to each other and that each extend along a second direction orthogonal to the first direction. The TFT substrate also includes a plurality of thin film transistors (TFTs) 103 that function as switching elements. The TFT substrate further includes a plurality of pixel electrodes 106 formed on a surface thereof facing the CF substrate. Each TFT 103 is provided in the vicinity of a respective point of intersection of the gate lines (G1-Gn) and the data lines (D1-Dm).

The CF substrate includes a plurality of common electrodes 107 opposite to the pixel electrodes 106. In particular, the common electrodes 107 are formed on a surface of the CF substrate facing the TFT substrate, and are made from a transparent material such as ITO (Indium-Tin Oxide) or the like.

Each TFT 103 includes a gate electrode 131, a source electrode 132, and a drain electrode 33. An exemplary one of the TFTs 103 is labeled in detail in FIG. 1. In this TFT 103, the gate electrode 131, the source electrode 132, and the drain electrode 133 are connected to a gate line Gn-1, a data line Dm-1, and one pixel electrode 106 respectively. Liquid crystal material sandwiched between the pixel electrode 106 and one common electrode 107 on the CF substrate (not shown) is represented as a liquid crystal capacitor (Clc) 108. A storage capacitor (Cs) 104 is formed between a next gate line Gn and the drain electrode 133 of the TFT 103.

Figure 2:
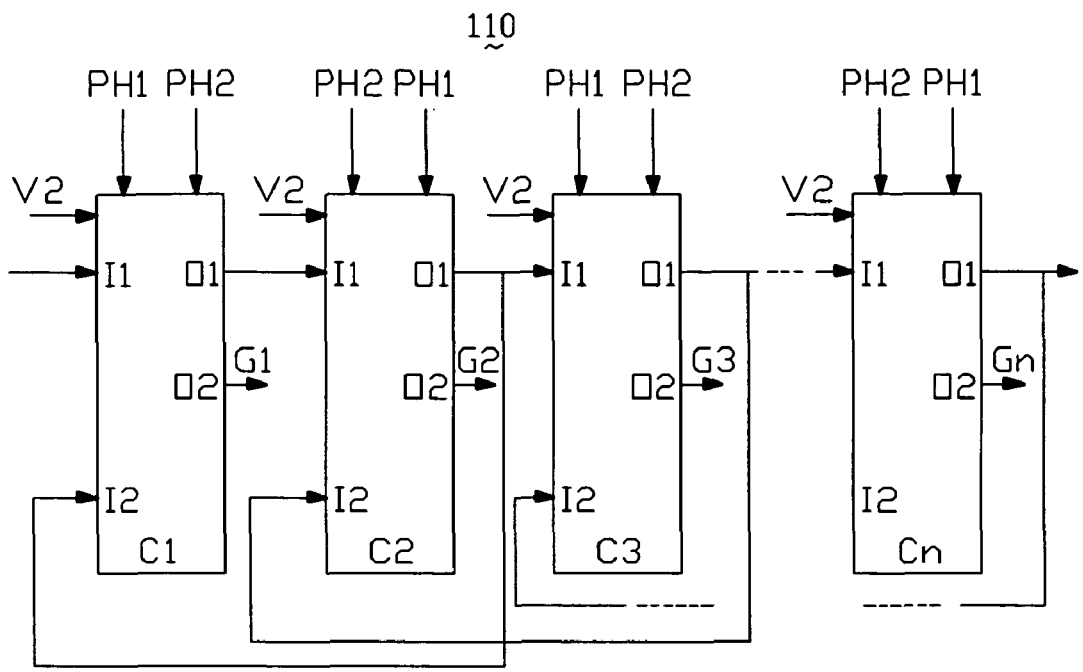
FIG. 2 is an abbreviated block diagram of the gate driving circuit of the TFT-LCD of FIG. 1.

FIG. 2 is an abbreviated block diagram of the gate driving circuit 110. The gate driving circuit 110 includes a plurality of circuit units (C1-Cn). Each of the circuit units (C1-Cn) includes a first input terminal I1, a second input terminal I2, a first output terminal O1, and a second output terminal O2. A first power supply PH1, a second power supply PH2, and a third power supply V2 are provided to each circuit unit Cn. The first power supply PH1 is an alternating current power supply. The second power supply PH2 is an alternating current power supply that has a reversed phase relative to the first power supply PH1. The third power supply V2 is a low voltage direct current (DC) power supply.

The circuit units (C1-Cn) are connected in series through the corresponding first output terminals O1 and first input terminals I1. The first input terminal of the circuit unit C1 is connected to the first output terminal O1 of the circuit unit Cn-1. The first output terminal O1 of the circuit unit Cn is connected to the second input terminal I1 of the circuit unit Cn-1. The second output terminal O2 of each of the circuit units (C1-Cn) is connected to a respective one of the gate lines (G1-Gn).

Figure 3:
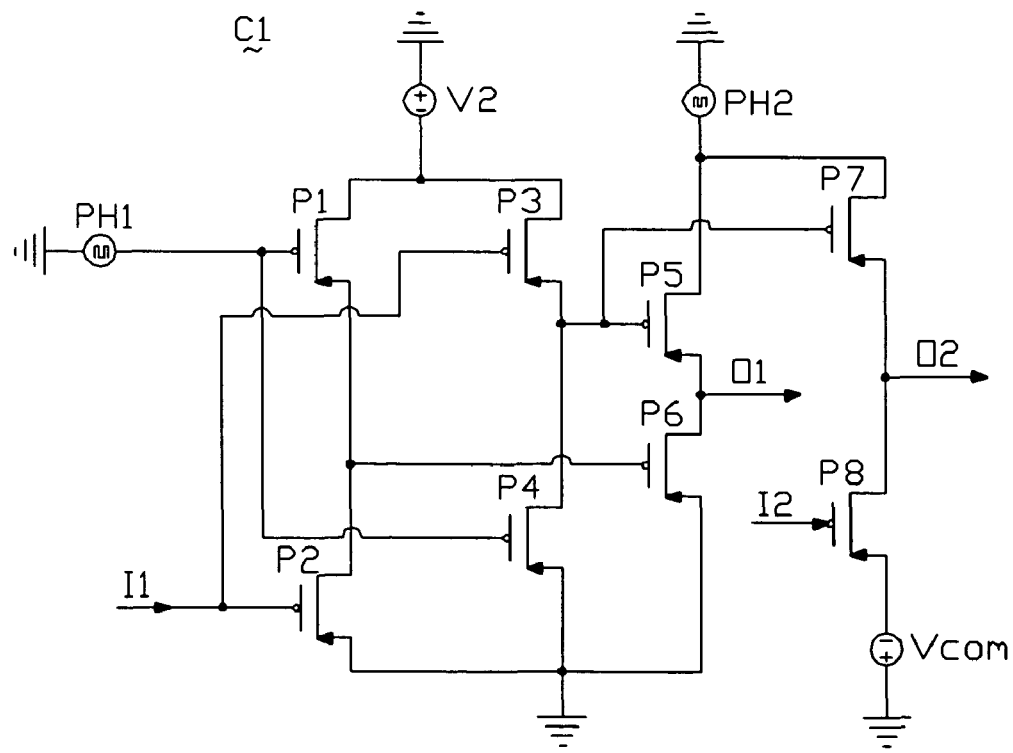
FIG. 3 is a circuit diagram of an exemplary circuit unit of the gate driving circuit of FIG. 2.

FIG. 3 is a circuit diagram of an exemplary circuit unit C1. The circuit unit C1 includes a first transistor P1, a second transistor P2, a third transistor P3, a fourth transistor P4, a fifth transistor P5, a sixth transistor P6, a seventh transistor P7, and an eighth transistor P8. Each of the transistors (P1-P8) includes a gate electrode, a source electrode, and a drain electrode.

The first transistor P1 and the second transistor P2 are connected in series between the third power supply V2 and ground through the drain electrode of the first transistor P1, the source electrode of the first transistor P1, the drain electrode of the second transistor P2, and the source electrode of the second transistor P2.

The third transistor P3 and the fourth transistor P4 are connected in series between the third power supply V2 and ground through the drain electrode of the third transistor P3, the source electrode of the third transistor P3, the drain electrode of the fourth transistor P4, and the source electrode of the fourth transistor P4.

The fifth transistor P5 and the sixth transistor P6 are connected in series between the second power supply PH2 and ground through the drain electrode of the fifth transistor P5, the source electrode of the fifth transistor P5, the drain electrode of the sixth transistor P6, and the source electrode of the sixth transistor P6.

The seventh transistor P7 and the eighth transistor P8 are connected in series between the second power supply PH2 and a common voltage Vcom of the TFT-LCD 100 through the drain electrode of the seventh transistor P7, the source electrode of the seventh transistor P7, the drain electrode of the eighth transistor P8, and the source electrode of the eighth transistor P8.

The gate electrode of the first transistor P1 and the gate electrode of the fourth transistor P4 are connected to the first power supply PH1.

The gate electrode of the second transistor P2 and the gate electrode of the third transistor P3 are connected to be the first input terminal I1.

The gate electrode of the fifth transistor P5 is connected to a connecting node between the source electrode of the third transistor P3 and the drain electrode of the fourth transistor P4.

The gate electrode of the sixth transistor P6 is connected to a connecting node between the source electrode of the first transistor P1 and the drain electrode of the second transistor P2.

The gate electrode of the seventh transistor P7 is connected to the gate electrode of the fifth transistor P5. The gate electrode of the eighth transistor P8 is defined to be the second input terminal I2. A connecting node between the source electrode of the fifth transistor P5 and the drain electrode of the sixth transistor P6 is defined to be the first output terminal O1. A connecting node between the source electrode of the seven transistor P7 and the drain electrode of the eight transistor P8 is defined to be the second output terminal O2.

The first output terminal O1 outputs the second power supply PH2 when the fifth transistor P5 is activated and the sixth transistor P6 is turned off. The first output terminal O1 outputs a zero volt voltage when the fifth transistor P5 is turned off the sixth transistor P6 is activated.

The second output terminal O2 outputs the second power supply PH2 when the seventh transistor P7 is activated and the eighth transistor P8 is turned off. The second output terminal O2 outputs the common voltage Vcom when the seventh transistor P7 is turned off and the eighth transistor P8 is activated.

Figure 4:
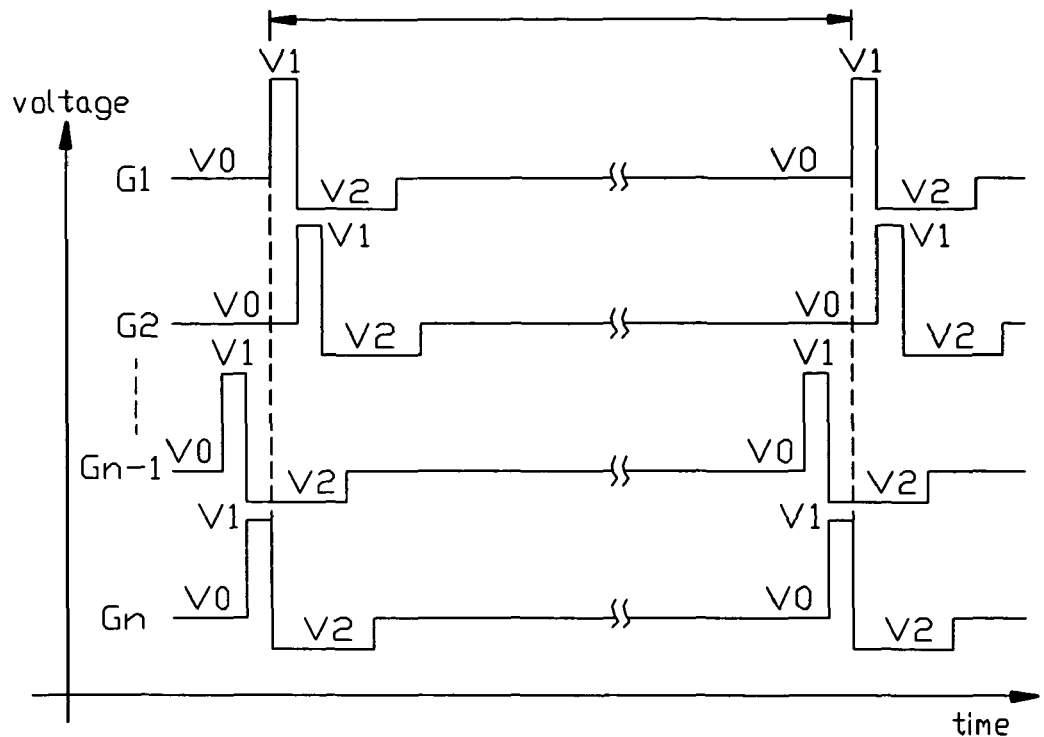
FIG. 4 is graph showing abbreviated voltage waves of a plurality of scanning signals generated by the gate driving circuit of the TFT-LCD of FIG. 1.

FIG. 4 shows abbreviated voltage waves of a plurality of scanning signals generated by the gate driving circuit 110. V0 represents a gate-off voltage that is generated by the gate driving circuit 110 and is equal to zero volts. V1 represents a gate-on voltage that is generated by the gate driving circuit 110 and is equal to 10 volts. V2 represents a feed-through compensation voltage which is generated by the gate driving circuit 110 and is equal to −2 volts. The gate driving circuit 1 sequentially provides a gate-on voltage V1, a feed-through compensation voltage V2, and a gate-off voltage V0 as a 3-level scanning signal to each of the gate lines (G1-Gn) each time. In a frame time (shown as a double-headed arrow), the gate driving circuit 110 sequentially scans the gate lines from G1 to Gn with the 3-level scanning signals. A method whereby the gate driving circuit 110 provides 3-level scanning signals to scan the gate lines (G1-Gn) is defined to be a 3-level driving method.

For example, after the gate-on voltage V1 is provided to one gate line Gi (1≦i≦n) of the gate lines (G1-Gn), the feed-through compensation voltage V2 is provided to the gate line Gi. Then the gate-off voltage V0 is provided to the gate line Gi. Thus the gate line Gi is scanned by the 3-level scanning signal. At the time the feed-through compensation voltage V2 starts to be provided to the gate line Gi, the gate-on voltage V1 simultaneously starts to be provided to the next gate line Gi+1 of the gates line (G1-Gn). After the gate-on voltage V1 is provided to the gate line Gi+1, the feed-through compensation voltage V2 and the gate-off voltage V0 are sequentially provided to the gate line Gi+1.

The feed-through compensation voltage V2 applied to the gate line Gi can depress or even eliminate the feed-through voltage generated by the storage capacitor 104 (which is located between the next gate line Gi+1 and the drain electrode 133 of the TFT 103 connected to the gate line Gi) when the gate-on voltage V1 is applied to the gate line Gi+1.

Figure 5:
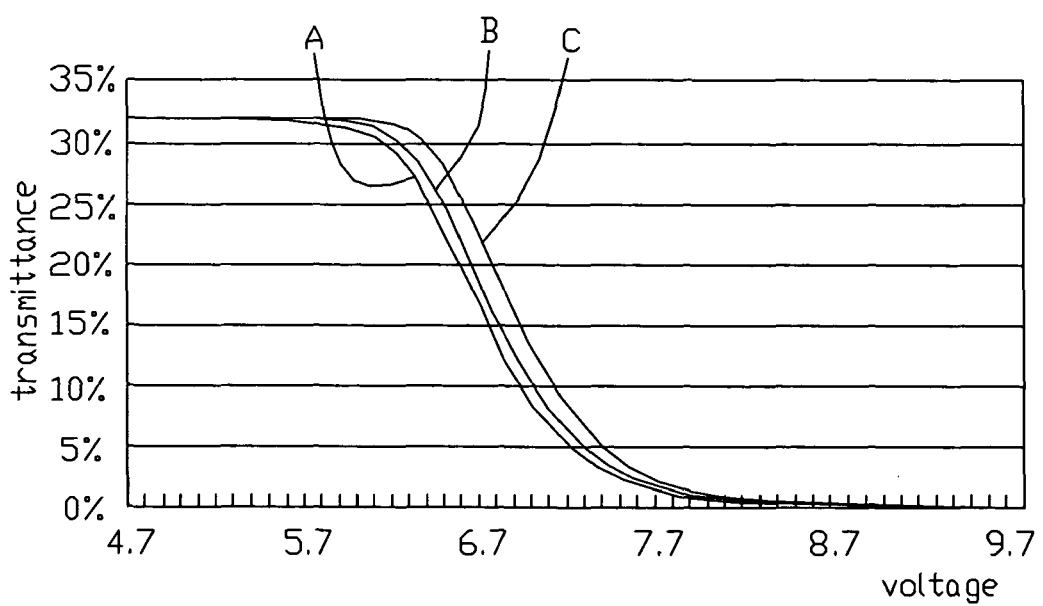
FIG. 5 is an exemplary voltage-transmittance graph which shows relationship between the transmittance of a pixel unit of the TFT-LCD and a gradation voltage applied to the pixel unit.
Figure 6:
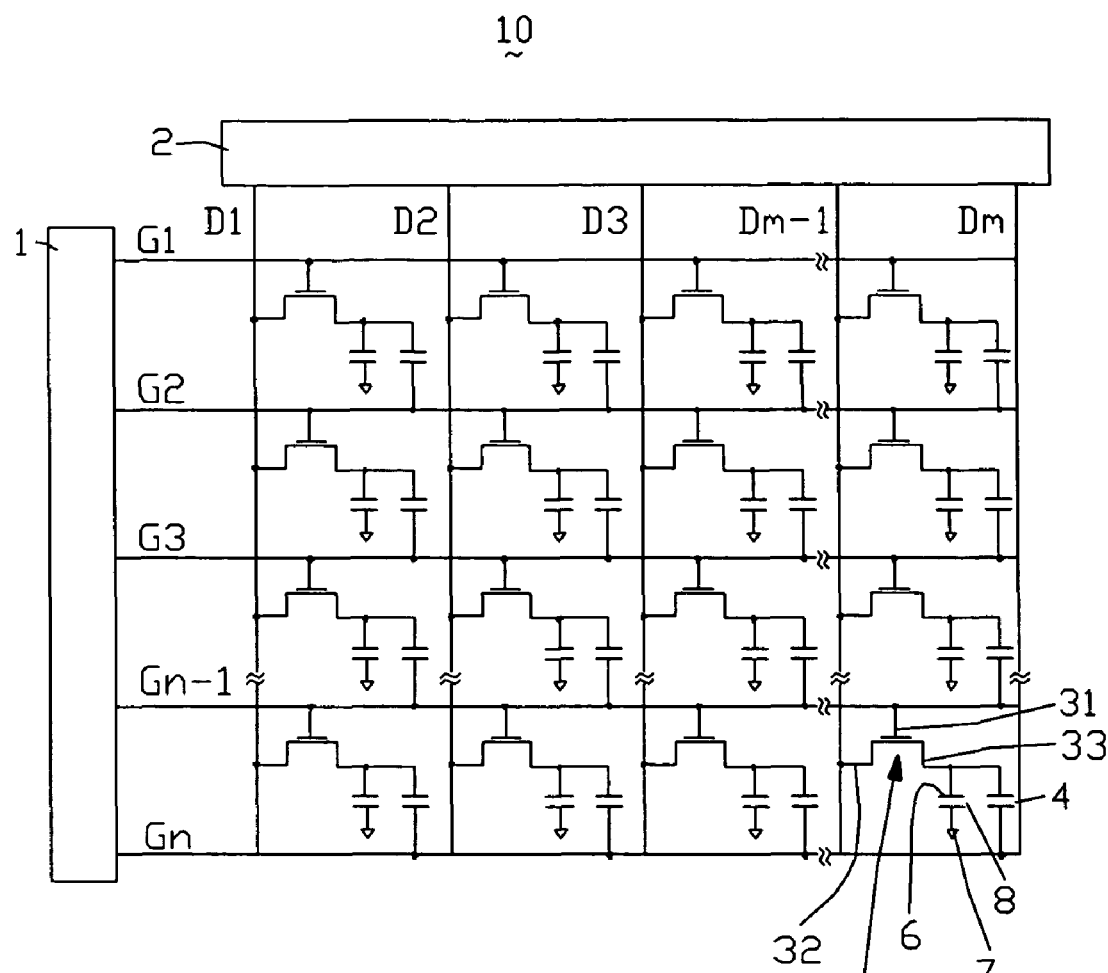
FIG. 6 is an abbreviated circuit diagram of a conventional TFT-LCD, the TFT-LCD including a gate driving circuit.
Figure 7:
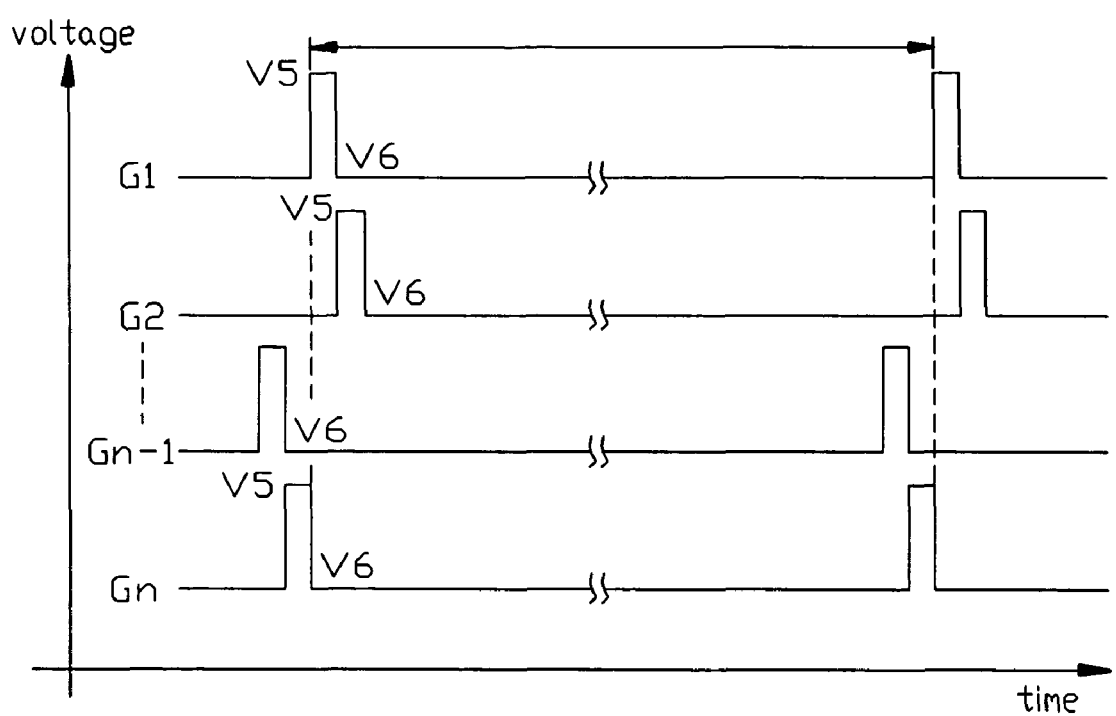
FIG. 7 is a graph showing abbreviated voltage waves of a plurality of scanning signals generated by the gate driving circuit of the TFT-LCD of FIG. 6.

FIG. 5 is an exemplary voltage-transmittance graph which shows relationship between the transmittance of a pixel unit of the TFT-LCD 100 and the gradation voltage applied to the pixel unit. Curve "A" represents an ideal relationship between the transmittance of a pixel unit of an ideal TFT-LCD 100 and the gradation voltage applied to the pixel unit. Curve "B" represents the relationship between the transmittance of a pixel unit of an ideal TFT-LCD 100 which is driven by a 3-level driving method, and the gradation voltage applied to the pixel unit. Curve "C" represents the relationship between the transmittance of a pixel unit of the above-described conventional TFT-LCD 10 which is driven by a 2-level driving method, and the gradation voltage applied to the pixel unit. Comparing curve "B" and curve "C", the position of curve "B" is closer to the ideal relationship curve "A" than is curve "C". This demonstrates the TFT-LCD 100 which is driven by the 3-level driving method can depress (or even eliminate) the feed-through voltage generated by the storage capacitor 104 which is positioned between the drain electrode 133 of the TFT 103 connected to the gate line Gi and the next gate line Gi+1.

It is to be understood, however, that even though numerous characteristics and advantages of the present embodiments have been set out in the foregoing description, together with details of the structures and functions of the embodiments, the disclosure is illustrative only, and changes may be made in detail, including in matters of shape, size, and arrangement of parts within the principles of the invention to the full extent indicated by the broad general meaning of the terms in which the appended claims are expressed.

What is claimed is:

1. A thin film transistor liquid crystal display (TFT-LCD) comprising:

a liquid crystal display (LCD) panel comprising a number n (where n is a natural number) of gate lines G1-Gn that are parallel to each other;

a data driving circuit; and a gate driving circuit comprising a number n (where n is a natural number) of circuit units C1-Cn and configured for sequentially providing 3-level scanning signals to scan the gate lines G1-Gn, each 3-level scanning signal sequentially comprising a gate-on voltage, a feed-through compensation voltage, and a gate-off voltage wherein the gate-on voltage starts to be provided to a (Gi+1)th (1≦i≦n−1) of the gate lines G1-Gn at the time when the feed-through compensation voltage starts to be provided to a (Gi)th of the gate lines G1-Gn, each of the circuit units C1-Cn comprising:

a first input terminal;

a second input terminal;

a first output terminal;

a second output terminal;

an alternating current first power supply;

an alternating current second power supply;

a direct current (DC) third power supply;

wherein the first input terminal of a (Ci+1)th (1≦i≦n−1) of the circuit units C1-Cn is connected to the first output terminal of a (Ci)th of the circuit units C1-Cn, the first output terminal of the (Ci+1)th circuit unit is connected to the second input terminal of the (Ci)th circuit unit, and the second output terminal of each of the circuit units C1-Cn is connected to a respective gate line G1-Gn of the LCD panel;

wherein each of the circuit units C1-Cn further comprises a first transistor, a second transistor, a third transistor, a fourth transistor, a fifth transistor, a sixth transistor, a seventh transistor, and an eighth transistor, each transistor comprises a gate electrode, a source electrode, and a drain electrode, and the first transistor and the second transistor are connected in series between the third power supply and ground through the drain electrode of the first transistor, the source electrode of the first transistor, the drain electrode of the second transistor, and the source electrode of the second transistor;

the third transistor and the fourth transistor are connected in series between the third power supply and ground through the drain electrode of the third transistor, the source electrode of the third transistor, the drain electrode of the fourth transistor, and the source electrode of the fourth transistor;

the fifth transistor and the sixth transistor are connected in series between the second power supply and ground through the drain electrode of the fifth transistor, the source electrode of the fifth transistor, the drain electrode of the sixth transistor, and the source electrode of the sixth transistor;

the seventh transistor and the eighth transistor are connected in series between the second power supply and a common voltage of the TFT-LCD through the drain electrode of the seventh transistor, the source electrode of the seventh transistor, the drain electrode of the eighth transistor, and the source electrode of the eighth transistor;

the gate electrode of the first transistor and the gate electrode of the fourth transistor are connected to the first power supply;

the gate electrode of the fifth transistor is connected to a connecting node between the source electrode of the third transistor and the drain electrode of the fourth transistor, the gate electrode of the sixth transistor is connected to a connecting node between the source electrode of the first transistor and the drain electrode of the second transistor, and the gate electrode of the seventh transistor is connected to the gate electrode of the fifth transistor;

the gate electrode of the second transistor and the gate electrode of the third transistor are connected to the first input terminal, the gate electrode of the eighth transistor is defined to be the second input terminal, a connecting node between the source electrode of the fifth transistor and the drain electrode of the sixth transistor is defined to be the first output terminal, and a connecting node between the source electrode of the seventh transistor and the drain electrode of the eighth transistor is defined to be the second output terminal.

2. The TFT-LCD as claimed in claim 1, wherein the first output terminal outputs the second power supply when the fifth transistor is activated and the sixth transistor is turned off.

3. The TFT-LCD as claimed in claim 1, wherein the first output terminal outputs zero voltage when the fifth transistor is turned off and the sixth transistor is activated.

4. A method for driving a TFT-LCD, wherein the TFT-LCD comprises a number n (where n is a natural number) of gate lines G1-Gn that are parallel to each other, a plurality of data lines that are parallel to each other and cross the gate lines, and a plurality of thin film transistors each provided in the vicinity of a respective point of intersection of the gate lines G1-Gn and the data lines, a gate electrode of each TFT being connected to a corresponding (Gi)th ($1 \leq i \leq n-1$) of the gate lines G1-Gn, a storage capacitor being formed between a corresponding next (Gi+1)th gate line and a drain electrode of the TFT, the method comprising:

a gate driving circuit generating a first 3-level scanning signal that sequentially comprises a first gate-on voltage, a first feed-through compensation voltage, and a first gate-off voltage;

providing the first 3-level scanning signal to the (Gi)th gate line;

the gate driving circuit generating a second 3-level scanning signal that sequentially comprises a second gate-on voltage, a second feed-through compensation voltage, and a second gate-off voltage; and providing the second 3-level scanning signal to the (Gi+1)th gate line;

wherein the second gate-on voltage starts to be provided to the (Gi+1)th gate line at the time when the first feed-through compensation voltage starts to be provided to the (Gi)th gate line, a voltage of the gate-on voltage is approximately equal to 10 volts, a voltage of the gate-off voltage is approximately equal to 0 volts, and a voltage of the feed-through compensation voltage is approximately equal to −2 volts.

* * * * *